United States Patent [19]

Sugawara

[11] Patent Number: 5,285,121
[45] Date of Patent: Feb. 8, 1994

[54] CURRENT SWITCHING CIRCUIT
[75] Inventor: Mitsutoshi Sugawara, Tokyo, Japan
[73] Assignee: NEC Corporation, Tokyo, Japan
[21] Appl. No.: 11,184
[22] Filed: Jan. 29, 1993
[30] Foreign Application Priority Data Feb. 3, 1992 [JP] Japan ........................................ 17398

[51] Int. Cl.$^5$ .......................... H03F 3/04; H03F 3/193
[52] U.S. Cl. ..................................... 307/570; 307/254; 307/495; 307/446; 307/573; 307/270
[58] Field of Search ............... 307/254, 264, 570, 495, 307/446, 494

[56] References Cited

U.S. PATENT DOCUMENTS

| 4,678,942 | 7/1987 | Kanai et al. | 307/270 |
| 4,798,981 | 1/1989 | Tsugaru et al. | 307/570 |
| 4,937,480 | 6/1990 | Higuchi et al. | 307/570 |
| 5,063,310 | 11/1991 | Shinozaki | 307/570 |

FOREIGN PATENT DOCUMENTS 3-160603  7/1991  Japan .

Primary Examiner—William L. Sikes
Assistant Examiner—My Trangnton
Attorney, Agent, or Firm—Laff, Whitesel, Conte & Saret

[57] ABSTRACT

A current switching circuit includes a constant current source, a first transistor, a first resistor, second and third transistors, a selecting means, and a second resistor. The constant current source supplies a constant current. The first transistor is connected in series with the constant current source and has a base biased by one terminal of a power supply. The first resistor is connected between the first transistor and the other terminal of the power supply. The second and third transistors have collector currents as output currents and are rendered conductive by applying an output voltage of the first transistor to bases of the second and third transistors. The selecting means selectively applies the output voltage of the first transistor to the bases of the second and third transistors. The second resistor is connected between the other terminal of the power supply and a common connection point between emitters of the first and second transistors.

9 Claims, 3 Drawing Sheets

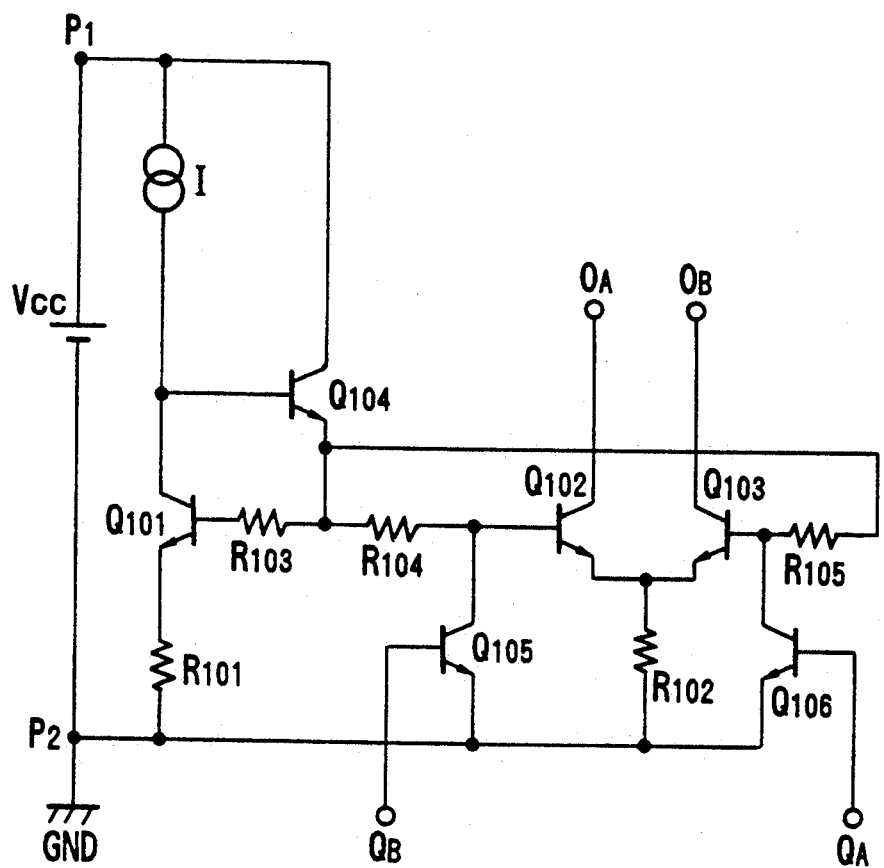
F I G. 1

CURRENT SWITCHING CIRCUIT

BACKGROUND OF THE INVENTION

The present invention relates to a current switching circuit and, more particularly, to a current switching circuit having a wide output voltage range and equal output current values.

As a conventional current switching circuit, a current switching circuit, shown in FIG. 3, for switching and outputting a constant current to a first terminal $O_A$ or a second terminal $O_B$ is known.

In this case, a current which is proportional to a current flowing from a constant current source I is obtained as a collector current of a transistor $Q_9$ by transistors $Q_1$, $Q_4$, and $Q_9$ and resistors $R_1$ and $R_2$ constituting a current mirror circuit.

The collector current of the transistor $Q_9$ is switched by transistors $Q_2$ and $Q_3$ differentially operated by a control signal $Q_A$ and an inverted signal $Q_B$ thereof to obtain a switching output from the output terminal $O_A$ or $O_B$.

In the conventional current switching circuit, in order to operate the output terminal $O_A$ and $O_B$ as constant current terminals, even when the output voltages of the output terminals $O_A$ and $O_B$ are minimum, the operations of the transistors $Q_2$, $Q_3$, and $Q_9$ must be set within a non-saturation region. For this reason, even when the voltages of the output terminals $Q_A$ and $Q_B$ are optimally selected, a voltage of about 1 V must be generated with reference to the ground point. That is, a voltage obtained by subtracting about 1 V from the power supply voltage $V_{CC}$ is a dynamic range. When the power supply voltage $V_{CC}$ is low, especially, the dynamic range is narrowed.

FIG. 4 shows another conventional current switching circuit described in Japanese Patent Laid-Open No. 3-160603 filed by the present applicant. A voltage generated by a resistor $R_1$ and a base-emitter voltage of a transistor $Q_1$ by means of a current from a constant current source I is applied to the base of a transistor $Q_2$ through a transistor $Q_7$ constituting the switching circuit, and the emitter of the transistor $Q_2$ is grounded through a resistor $R_2$, i.e., connected to the other terminal of the resistor $R_1$. A transistor $Q_{15}$ and an inverter INV1 are operated to turn off the transistor $Q_2$, and reference symbol $C_1$ denotes a control input terminal. Similarly, a voltage generated by the resistor $R_1$ and the base-emitter voltage of the transistor $Q_1$ is applied to the base of a transistor $Q_3$ through a transistor $Q_8$ constituting the switching circuit, and the emitter of the transistor $Q_3$ is grounded through a resistor $R_{12}$. A transistor $Q_{16}$ and an inverter INV2 are operated to turn off the transistor $Q_3$, and reference symbol $C_2$ denotes a control input terminal. A transistor $Q_4$ is a compensation circuit for a base current. A transistor $Q_{10}$ is used for compensating for voltage drop caused by the ON resistance of the transistor $Q_7$ or $Q_8$ and the base current thereof, and the transistor $Q_{10}$ is always set in an ON state.

However, when the current value of the constant current source I is represented by I, and the resistances of the resistors $R_1$, $R_2$, and $R_{12}$ are represented by $R_1$, $R_2$, and $R_{12}$, respectively, a current flowing in an output terminal $O_1$ has a value of $(I \times R_1/R_2)$, and a current flowing in an output terminal $O_2$ has a value of $(I \times R_1/R_{12})$. The two output current values disadvantageously vary at about several %.

SUMMARY OF THE INVENTION

It is an object of the present invention to provide a current switching circuit in which the dynamic range of an output voltage is widened when a constant current is to be switched and output.

It is another object of the present invention to provide a current switching circuit for preventing variations in output voltages when a constant current is to be switched and output.

In order to achieve the above objects, according to the present invention, there is provided a current switching circuit comprising a constant current source for supplying a constant current, a first transistor connected in series with the constant current source and having a base biased by one terminal of a power supply, a first resistor connected between the first transistor and the other terminal of the power supply, second and third transistors having collector currents as output currents and rendered conductive by applying an output voltage of the first transistor to bases of the second and third transistors, switching means for selectively applying the output voltage of the first transistor to the bases of the second and third transistors, and a second resistor connected between the other terminal of the power supply and a common connection point between emitters of the first and second transistors.

BRIEF DESCRIPTION OF THE DRAWINGS

FIG. 1 is a circuit diagram showing a current switching circuit according to the first embodiment of the present invention;

DESCRIPTION OF THE PREFERRED EMBODIMENTS

Figure 2:
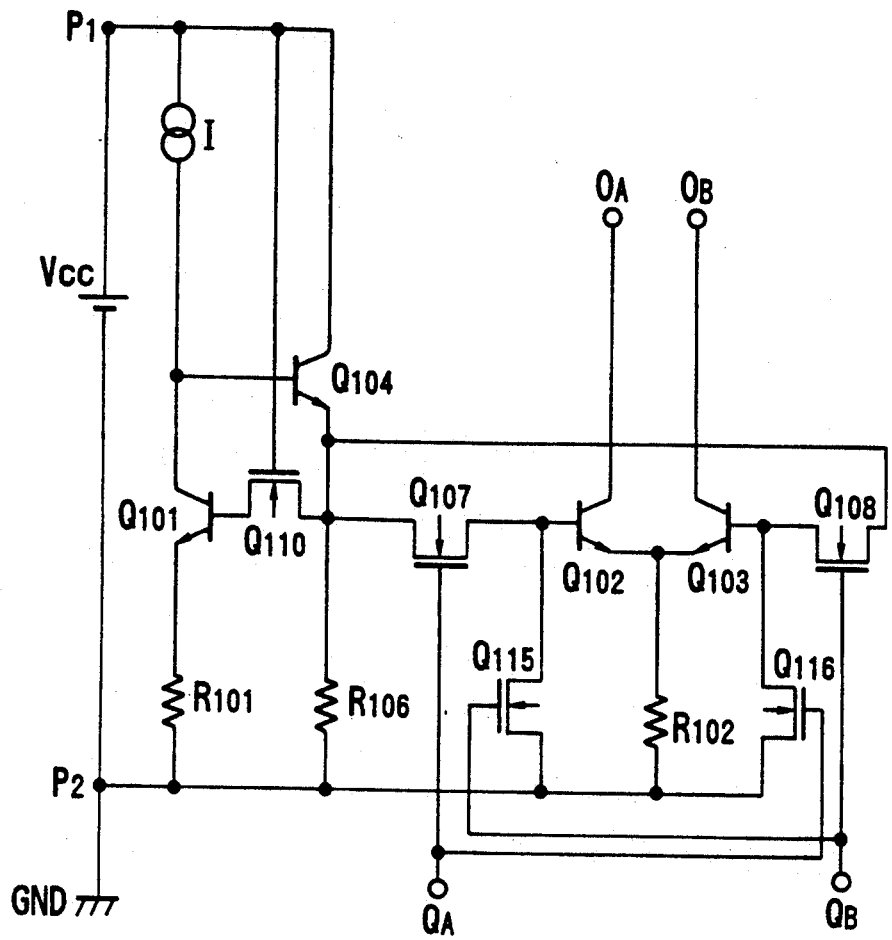
FIG. 2 is a circuit diagram showing a current switching circuit according to the second embodiment of the present invention.

The present invention will be described below with reference to the accompanying drawings.

FIG. 1 shows a current switching circuit according to the first embodiment of the present invention.

In FIG. 1, a constant current source I, a transistor $Q_{101}$, a resistor $R_{101}$ are connected in series between first and second power supply terminals $P_1$ and $P_2$ applied with a power supply voltage $V_{CC}$. The base of the transistor $Q_{101}$ is connected one terminal of the resistor $R_{103}$, and the other terminal of the resistor $R_{103}$ is connected to the base of a transistor $Q_{102}$ through a resistor $R_{104}$ and to the base of a transistor $Q_{103}$ through a resistor $R_{105}$. The collector of the transistor $Q_{102}$ is connected to an output terminal $O_A$ and the emitter of the transistor $Q_{102}$ is connected to the second power supply terminal $P_2$ through a resistor $R_{102}$. The collector of the transistor $Q_{103}$ is connected to an output terminal $O_B$, and the emitter of the transistor $Q_{103}$ is connected to the connection point between the emitter of the transistor $Q_{102}$ and the resistor $R_{102}$. The bases of the transistors $Q_{102}$ and $Q_{103}$ are connected to the second power supply terminal $P_2$ through transistors $Q_{105}$ and $Q_{106}$, the base of the transistor $Q_{105}$ is connected to a control input terminal $Q_B$, and the base of the transistor $Q_{106}$ is connected to a control input terminal $Q_A$. A base current source transistor $Q_{104}$ having the base connected to the collector of the transistor $Q_{101}$ has the collector connected to the first power supply terminal $P_1$, and the emitter of the transistor $Q_{104}$ is connected to the connection point between resistors $R_{103}$ and $R_{104}$. The second power supply terminal $P_2$ is connected to a signal ground GND.

The npn transistors $Q_{101}$, $Q_{102}$, and $Q_{103}$ and the resistors $R_{101}$ and $R_{102}$ constitute a current mirror circuit having a current from the constant current source I as an input. That is, a voltage generated by the series circuit of the base-emitter of the transistor $Q_{101}$ and the resistor $R_{101}$ by means of the constant current source I is applied to the bases of the transistors $Q_{102}$ and $Q_{103}$ through the resistors $R_{104}$ and $R_{105}$. When any one of the npn transistors $Q_{106}$ and $Q_{105}$ is turned on by the control input terminal $Q_A$ and the inverting control terminal $Q_B$, the collector voltage of the ON transistor is decreased. For this reason, the base voltage of any one of the transistors $Q_{102}$ and $Q_{103}$ is decreased, and the transistor having the decreased base voltage is set in a cutoff state. Therefore, only one of the transistors $Q_{102}$ and $Q_{103}$ is turned on.

Since a voltage obtained by subtracting the base-emitter voltage (about 0.7 V) of the transistor $Q_{102}$ or $Q_{103}$ from the sum of the base-emitter voltage (about 0.7 V) of the transistor $Q_{101}$ and a voltage ($I \times R_{101}$) generated by the resistor $R_{101}$ connected in series with the transistor $Q_{101}$ is generated by the resistor $R_{102}$, a current flowing in the resistor $R_{102}$ has a value of ($I \times R_{101}/R_{102}$). This current is selectively used as the collector current of the transistor $Q_{102}$ or $Q_{103}$, and flows into the output terminal $O_A$ or $O_B$. In this case, a voltage generated by the resistor $R_{104}$ or $R_{105}$ by means of the base current of the transistor $Q_{102}$ and $Q_{103}$ is compensated by voltage drop caused by the base current of the transistor $Q_{101}$ through the resistor $R_{103}$. In addition, the transistor $Q_{104}$ is inserted to compensate for the base currents of the transistors $Q_{101}$, $Q_{102}$, and $Q_{103}$ and the collector currents of the control transistors $Q_{105}$ and $Q_{106}$.

Figure 3:
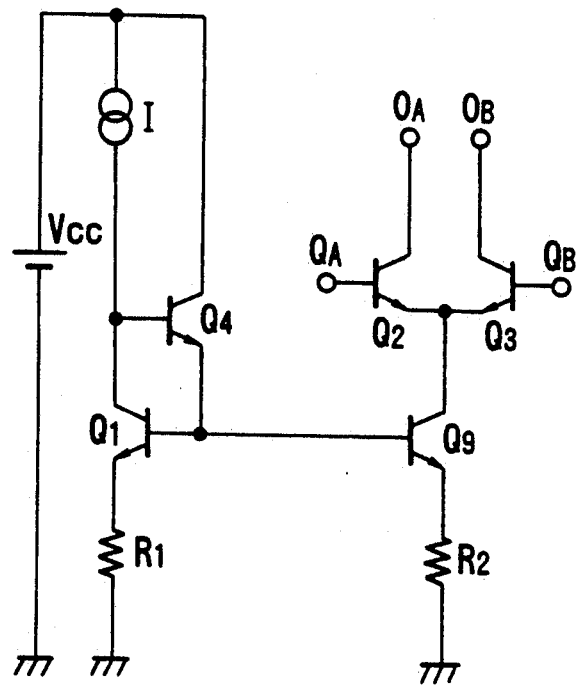
FIG. 3 is a circuit diagram showing a conventional current switching circuit.

In this embodiment, since the base currents of the output transistors $Q_{102}$ and $Q_{103}$ are differentially switched, the drawback of the circuit shown in FIG. 3 can be solved, and the dynamic range of an output voltage can be widened.

Figure 4:
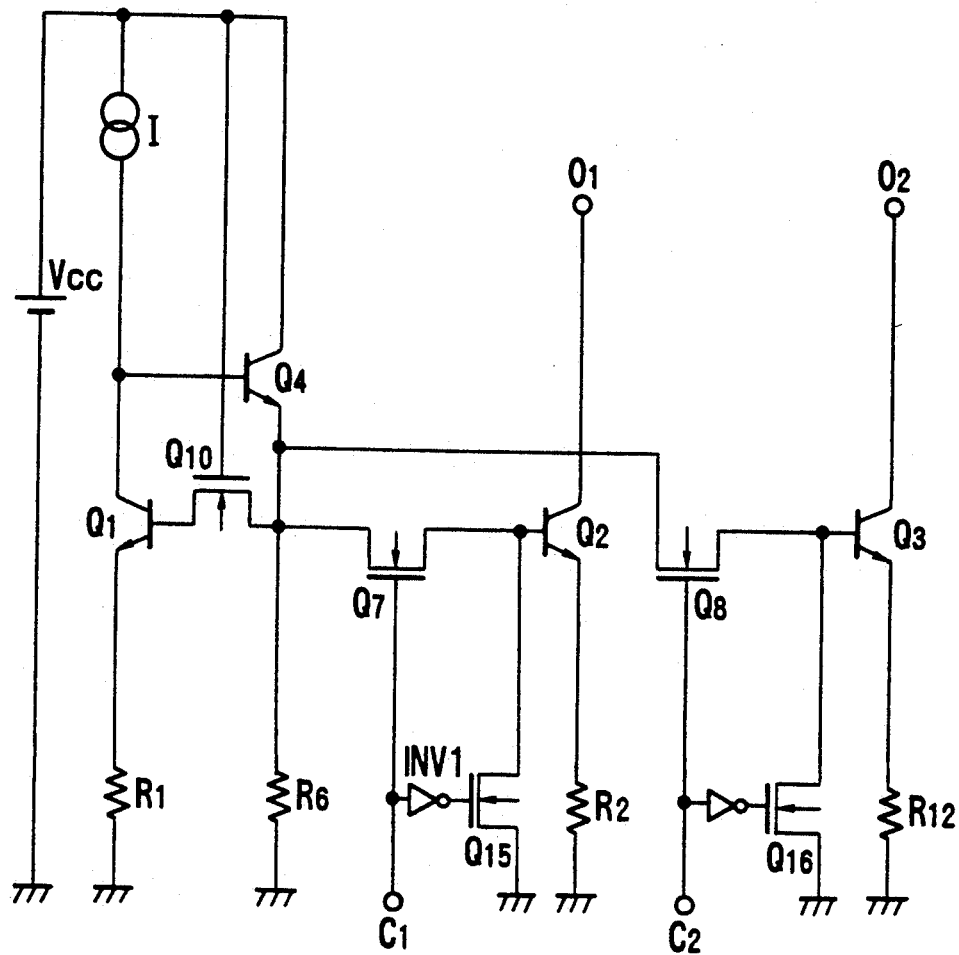
FIG. 4 is a circuit diagram showing another conventional current switching circuit.

FIG. 2 shows a current switching circuit according to the second embodiment of the present invention. Different points between the circuit in FIG. 1 and that in the FIG. 2 are as follows. That is, field effect transistors $Q_{107}$ and $Q_{108}$ are connected as a switching circuit in place of the resistors $R_{104}$ and $R_{105}$, a field effect transistor $Q_{110}$ is connected as a base current correction circuit in place of the resistor $R_{103}$, and field effect transistors $Q_{115}$ and $Q_{116}$ are connected in place of the transistors $Q_{105}$ and $Q_{106}$. The connection point between the field effect transistors $Q_{110}$ and $Q_{107}$ is connected to a second power supply terminal $P_2$, and the control inputs of the field effect transistors $Q_{116}$ and $Q_{107}$ are connected to a control input terminal $Q_A$. The control inputs of the field effect transistors $Q_{115}$ and $Q_{108}$ are connected to a control input terminal $Q_B$, and the control input of the field effect transistor $Q_{110}$ is connected to a first power supply terminal $P_1$. Since the control inputs to the control input terminals $Q_A$ and $Q_B$ are inverted from each other, the inverters INV1 and INV2 shown in FIG. 4 are not used. Therefore, the control input terminals $Q_A$ and $Q_B$ are connected to the gates of the field effect transistors $Q_{115}$ and $Q_{116}$, respectively, to complementarily operate the field effect transistors $Q_{107}$ and $Q_{115}$ and to complementarily operate the field effect transistors $Q_{108}$ and $Q_{116}$.

According to this embodiment, as in the first embodiment, since the resistor $R_{102}$ is commonly used, each of currents flowing in the output terminals $O_A$ and $O_B$ has a value of ($I \times R_{101}/R_{102}$), and variations in output current values can be eliminated. When this circuit is used in a magnetic recording circuit or the like, if the output currents of the output terminals $O_A$ and $O_B$ are different from each other, jitter is increased by a magnetization difference, and a noise margin is degraded. The elimination of the variations is very effective in practical use according to the present invention.

In addition, when the collector voltage of the transistor $Q_{102}$ or $Q_{103}$ is used in a non-saturation region, a voltage of several 100 mV with respect to ground is satisfactorily used and is half of the voltage used in the conventional switching circuit in FIG. 3. For this reason, the present invention is effective for widening a dynamic range when a voltage $V_{CC}$ is low.

In addition, according to a conventional technique, when a current mirror circuit is to be constituted, as shown in FIG. 4, different resistors are connected to the emitters of the transistors $Q_2$ and $Q_3$, respectively. In this case, the emitter currents of the transistors $Q_2$ and $Q_3$ have values of ($I \times R_{101}/R_{102}$) and ($I \times R_{101}/R_{112}$), respectively. When a ratio of the resistor $R_{102}$ to a resistor $R_{112}$ varies at several % in the manufacture of the switching circuit, each of the emitter currents also vary at several %. In each of the above embodiments, when the emitters of the transistors $Q_{102}$ and $Q_{103}$ are connected to only the common resistor $R_{102}$, each of the emitter currents has a value of ($I \times R_{101}/R_{102}$), and the variations in output current are eliminated. Therefore, unlike the conventional current switching circuit in FIG. 3, in the circuit according to the present invention, the emitter currents rarely vary.

As has been described above, according to the present invention, the first to third transistors constitute a current mirror circuit, and the emitters of the second and third transistors having the collectors respectively connected to the first and second output terminals are commonly connected. The commonly connected emitters are connected to the second power supply terminal through the second resistor, and the second and third transistors are set in an operative or non-operative state in response to the inputs into the first and second control input terminals. For this reason, the output saturation voltages of the first and second output terminals are decreased, and a dynamic range can be widened. In addition, even when the output terminal for obtaining an output is switched, variations in output currents can be prevented.

What is claimed is:

1. A current switching circuit comprising:
   a power supply having two terminals;
   a constant current source, connected to one terminal of said power supply, for supplying a constant current;
   a biasing circuit, connected between said constant current source and one terminal of said power supply;
   first and second transistors rendered conductive in response to the bias voltage from said biasing circuit to bases of said first and second transistors, collector currents of said first and second transistors being output to respective output terminals;

first and second selecting means for complementarily applying the bias voltage to the bases of said first and second transistors; and a first resistor connected between the other terminal of the power supply and a common connection point of emitters of said first and second transistors.

2. A circuit according to claim 1, wherein said first selecting means comprises a third transistor connected between the base of said first transistor and the other terminal of said power supply, said second selecting means comprises a fourth transistor connected between the base of said second transistor and the other terminal of said power supply, and said third and fourth transistors are differentially operated.

3. A circuit according to claim 1, further comprising second and third resistors respectively connected between an output of said biasing circuit for outputting the bias voltage and the bases of said first and second transistors.

4. A circuit according to claim 1, further comprising first and second field effect transistors respectively connected between an output of said biasing circuit for outputting the bias voltage and the bases of said first and second transistors, said first field effect transistor being turned on when said second transistor is turned off by said second selecting means, and said second field effect transistor being turned on when said first transistor is turned off by said first selecting means.

5. A circuit according to claim 4, wherein said selecting means comprising third and fourth field effect transistors respectively connected between the other terminal of said power supply and the bases of said first and second transistors, said second field effect transistor is turned on when said third field effect transistor is turned on, and said first field effect transistor is turned on when said fourth field effect transistor is turned on.

6. A circuit according to claim 1, wherein said biasing circuit comprises a first npn transistor having a collector connected to said constant source, a fourth resistor connected between an emitter of said first npn transistor and the other terminal of the power supply, a second npn transistor having a base connected to the collector of said first npn transistor and a collector connected to the one terminal of said power supply, and a fifth resistor connected between a base of said first npn transistor and an emitter of said second npn transistor.

7. A current switching circuit comprising:
a constant current source, connected to one terminal of a power supply, for supplying a constant source;
a first transistor connected in series with said constant source;
a first resistor connected between said first transistor and another terminal of the power supply, said first transistor and first resistor cooperatively outputting a bias voltage;
second and third transistors having emitters connected in common with each other and outputting collector currents to respective output terminals on a basis of an output of said first transistor;
a first connecting means for electrically connecting a collector and a base of said first transistor;
a second connecting means for electrically connecting the base of said first transistor and a base of said second transistor;
a third connecting means for electrically connecting the base of said first transistor and a base of said third transistor;
a second resistor connected between the emitters of said second and third transistor and another terminal of the power supply;
a first switching means, connected between the base of said second transistor and the other terminal of the power supply, for disabling said second transistor by turning it on; and
a second switching means, connected between the base of said third transistor and the other terminal of the power supply, for disabling said third transistor by turning it on, said first and second switching means being complementarily operated.

8. A circuit according to claim 7, wherein said first, second and third connecting means comprise resistor elements respectively.

9. A circuit according to claim 7, wherein said first connecting means comprises a first field effect transistor which is constantly turning on, said second connecting means comprises a second field effect transistor which is turned on when said second switching means is turned on, and said third connecting means comprises a third field effect transistor which is turned on when said first switching means is turned on.

* * * * *